(12) United States Patent
Chang et al.

(10) Patent No.: US 12,127,431 B2
(45) Date of Patent: Oct. 22, 2024

(54) OLED ARRAY SUBSTRATE, DISPLAY PANEL AND DISPLAY DEVICE

(71) Applicant: Kunshan Go-Visionox Opto-Electronics Co., Ltd., Jiangsu (CN)

(72) Inventors: Miao Chang, Jiangsu (CN); Lu Zhang, Jiangsu (CN); Siming Hu, Jiangsu (CN); Zhenzhen Han, Jiangsu (CN)

(73) Assignee: Kunshan Go-Visionox Opto-Electronics Co., Ltd., Kunshan (CN)

( * ) Notice: Subject to any disclaimer, the term of this patent is extended or adjusted under 35 U.S.C. 154(b) by 668 days.

(21) Appl. No.: 17/318,528

(22) Filed: May 12, 2021

(65) Prior Publication Data

US 2021/0265430 A1    Aug. 26, 2021

Related U.S. Application Data

(63) Continuation of application No. PCT/CN2019/114846, filed on Oct. 31, 2019.

(30) Foreign Application Priority Data

Apr. 4, 2019   (CN) .......................... 201910272786.5

(51) Int. Cl.
*H10K 59/121* (2023.01)
*H10K 50/86* (2023.01)
(Continued)

(52) U.S. Cl.
CPC ........... *H10K 59/121* (2023.02); *H10K 50/86* (2023.02); *H10K 59/131* (2023.02); *H10K 59/353* (2023.02); *H10K 59/65* (2023.02)

(58) Field of Classification Search
CPC .. H10K 59/121; H10K 59/131; H10K 59/353; H10K 50/86
(Continued)

(56) References Cited

U.S. PATENT DOCUMENTS 9,953,567 B2    4/2018  Wang
10,739,893 B2   8/2020  Park et al.
(Continued)

FOREIGN PATENT DOCUMENTS

CN       206322697 U       7/2017
CN       107863374    *    3/2018
(Continued)

OTHER PUBLICATIONS

Office Action, Korean Application No. 10-2021-7018900, with English translation.
(Continued)

*Primary Examiner* — Sheng-Bai Zhu
(74) *Attorney, Agent, or Firm* — Quarles & Brady LLP

(57) ABSTRACT

The present disclosure provides an OLED array substrate, a display panel and a display device. The OLED array substrate includes a first display region and a second display region; the first display region is adjacent to the second display region, and includes first OLED pixels arranged in an array; the second display region includes second OLED pixels arranged in an array; a pixel density of the second OLED pixels is less than a pixel density of the first OLED pixels; second pixel driving units of second OLED pixels and first pixel driving units of first OLED pixels in a same row are connected to a same first-type scan line, there is at least one second-type scan line between two adjacent first-type scan lines; one second-type scan line is only connected to first pixel driving units of first OLED pixels in a same row.

10 Claims, 7 Drawing Sheets

(51) Int. Cl.
*H10K 59/131* (2023.01)
*H10K 59/35* (2023.01)
*H10K 59/65* (2023.01)

(58) Field of Classification Search
USPC .......................................................... 257/40
See application file for complete search history.

(56) References Cited

U.S. PATENT DOCUMENTS

| | | | |
|---|---|---|---|
| 11,201,309 | B2 | 12/2021 | Abe et al. |
| 2011/0279128 | A1 | 11/2011 | VonStaudt |
| 2016/0293084 | A1 | 10/2016 | Guo et al. |
| 2018/0175074 | A1 | 6/2018 | Kurokawa |
| 2019/0326366 | A1 | 10/2019 | Fan et al. |
| 2020/0019747 | A1 | 1/2020 | Yang et al. |

FOREIGN PATENT DOCUMENTS

| | | | |
|---|---|---|---|
| CN | 207338380 U | | 5/2018 |
| CN | 108269840 A | | 7/2018 |
| CN | 108711404 A | | 10/2018 |
| CN | 108830234 A | | 11/2018 |
| CN | 109100891 | * | 12/2018 |
| CN | 109315049 A | | 2/2019 |
| CN | 208507679 U | | 2/2019 |
| CN | 208607570 U | | 3/2019 |
| EP | 2387021 A1 | | 11/2011 |
| EP | 3176772 | * | 6/2017 |
| JP | 2001075503 | * | 3/2001 |
| JP | 2005134421 A | | 5/2005 |
| JP | 2006079947 A | | 3/2006 |
| JP | 3923238 | * | 5/2007 |
| KR | 20120025885 A | | 3/2012 |
| KR | 20180050473 | * | 5/2018 |
| KR | 20180050473 A | | 5/2018 |
| KR | 1020190013130 A | | 2/2019 |
| TW | 201839745 A | | 11/2018 |
| WO | 2018196637 A1 | | 11/2018 |

OTHER PUBLICATIONS

Chinese First Office Action 100191 (CN Application No. 201910296084.0) with English Translation, dated Sep. 25, 2020, 13 pages.

Chinese Second Office Action 100191 (CN Application No. 201910296084.0) with English Translation, dated Nov. 24, 2020, 16 pages.

International Search Report and Written Opinion (International Application No. PCT/CN2019/114846) with English Translation, dated Jan. 23, 2020, 10 pages.

Extended European Search Report of Application No. 19922896.6 mailed on Jan. 25, 2022.

Office Action of Application No. 10-2021-7018900 dated Apr. 28, 2023.

* cited by examiner

OLED ARRAY SUBSTRATE, DISPLAY PANEL AND DISPLAY DEVICE

CROSS REFERENCE TO RELATED APPLICATIONS

The present application is a continuation application of the PCT application No. PCT/CN2019/114846, filed on Oct. 31, 2019 and titled "OLED Array Substrate, Display Panel and Display Device", which claims priority to Chinese Patent Application No. 201910272786.5, filed on Apr. 4, 2019 and entitled "OLED Array Substrate, Display Panel and Display Device", and the contents of the both applications are herein incorporated by reference in their entirety.

TECHNICAL FIELD

The present disclosure relates to the field of display technology.

BACKGROUND

With the rapid development of display devices, users have increasingly higher requirements for a proportion of a display screen. Since components such as a camera, a sensor, an earpiece, etc., usually need to be mounted in an upper portion of a display screen of a mobile terminal, a part of the upper portion of the display screen is usually reserved for mounting the above components in a notch design scheme adopted in the related art, which affects the overall consistency of the display screen, so that a full-screen display has received more and more attention from the industry.

SUMMARY

The present disclosure provides an OLED array substrate, a display panel and a display device, to address the deficiencies in the existing technologies.

In the first aspect of the present disclosure, an OLED array substrate is provided, which includes a first display region and a second display region; the first display region is adjacent to the second display region, the first display region includes first OLED pixels arranged in an array, the second display region includes second OLED pixels arranged in an array, a pixel density of the second OLED pixels is less than a pixel density of the first OLED pixels;

second pixel driving units of second OLED pixels and first pixel driving units of first OLED pixels which are located in a same row are connected to a same first-type scan line, there is at least one second-type scan line between two adjacent first-type scan lines, one second-type scan line is only connected to first pixel driving units of first OLED pixels which are located in a same row; and/or second pixel driving units of second OLED pixels and first pixel driving units of first OLED pixels which are located in a same column are connected to a same set of first-type data lines, there is at least one set of second-type data lines between two adjacent sets of first-type data lines, one set of second-type data lines is only connected to first pixel driving units of first OLED pixels which are located in a same column.

In the second aspect of the present disclosure, a display panel is provided, which includes:

the above-mentioned OLED array substrate;

an encapsulation layer, configured to encapsulate a side of the OLED array substrate away from a substrate of the OLED array substrate;

when the OLED array substrate further includes a third display region, a photosensitive device being provided behind the third display region.

In the third aspect of the present disclosure, a display device is provided, which includes:

a device body, having a device region;

the above-mentioned display panel;

the display panel covering the device body;

when the OLED array substrate further includes a third display region, the device region is located behind the third display region, and in the device region is provided a photosensitive device which emits or collects a light ray through the third display region.

According to the above embodiments, when the second pixel driving units of the second OLED pixels in the second display region and the first pixel driving units of the first OLED pixels in the first display region which are in the same row are connected to the same first-type scan line, there is at least one second-type scan line between two adjacent first-type scan lines, which can implement the display of the second display region in interlaced rows. When the second pixel driving units of the second OLED pixels and the first pixel driving units of the first OLED pixels which are in the same column are connected to the same set of first-type data lines, there is at least one set of second-type data lines between two adjacent sets of first-type data lines, which can implement the display of the second display region in interlaced columns. In such a way, when using the Sub Pixel Rendering (SPR) method to process the original image data of the same frame to obtain the image data of the same frame displayed in the second display region, the crosstalk between the image data of adjacent second OLED pixels in the second display region can be weakened, and the difficulty of the image processing can be reduced.

It should be appreciated that the above general description and the following detailed description are merely exemplary and explanatory, rather than limiting the present disclosure.

BRIEF DESCRIPTION OF THE DRAWINGS

The accompanying drawings herein are incorporated into the specification and constitute a part of the specification, which show embodiments that conform to the present disclosure, and are utilized together with the specification to explain the principle of the present disclosure.

DETAILED DESCRIPTION

With the rapid development of display devices, users have increasingly higher requirements for a proportion of a display screen. Since components such as a camera, a sensor, an earpiece, etc., usually need to be mounted in an upper portion of a display screen of a mobile terminal, a part of the upper portion of the display screen is usually reserved for mounting the above components in a notch design scheme adopted in the related art, which affects the overall consistency of the display screen, so that a full-screen display has received more and more attention from the industry.

Exemplary embodiments will be described in detail here, and examples thereof are shown in the accompanying drawings. When the following description refers to the accompanying drawings, unless otherwise indicated, the same numbers in different drawings represent the same or similar elements. The embodiments described in the following exemplary embodiments do not represent all embodiments consistent with the present disclosure. Rather, these embodiments are merely examples of a device and a method consistent with some aspects of the present disclosure as detailed in the appended claims.

Figure 1:
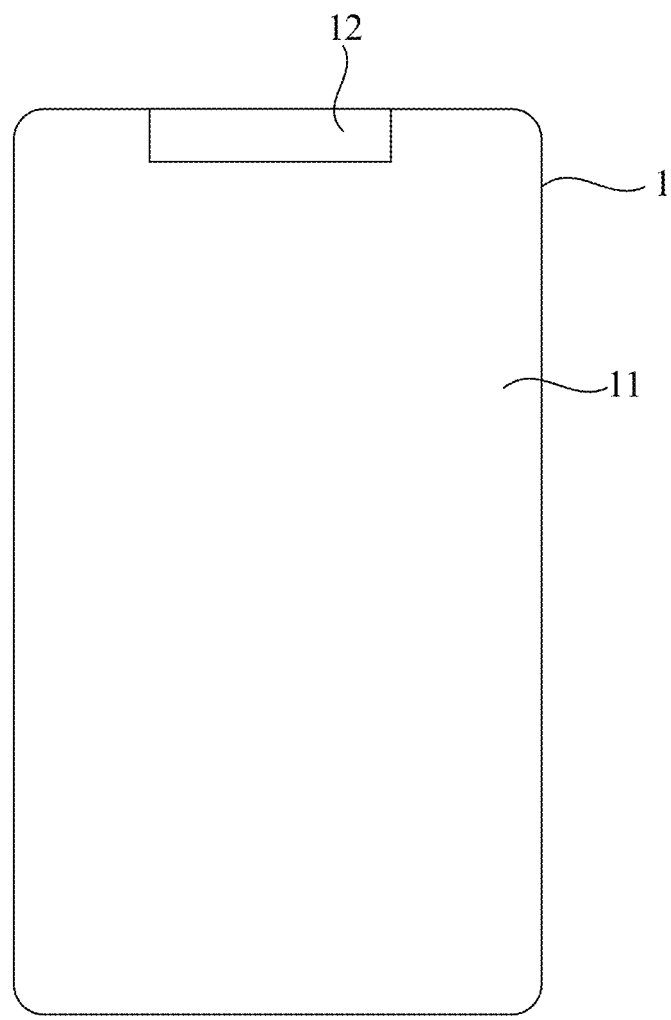
FIG. 1 is a schematic structure diagram of a full screen according to a related technology.

As shown in FIG. 1, there is a full screen 1 including a first display region 11 and a third display region 12. The third display region 12 can implement both a light transmission function and a display function. Behind the third display region 12 are provided photosensitive elements such as a camera, a distance sensor and the like. Since pixels in the third display region 12 and pixels in the first display region 11 are different in material or structure, a display brightness of the third display region 12 is quite different from that of the first display region 11, causing that there is a clear dividing line between the third display region 12 and the first display region 11, which affects the user experience.

A driving mode of the first display region 11 is active driving; and a driving mode of the third display region 12 is passive driving. In such a way, the display region on the screen requires two driving modes, which greatly increases the complexity of driving of the full screen.

As for the above technical problems, an embodiment of the present disclosure provides an OLED array substrate, a display panel and a display device capable of addressing the above technical problems and causing the display brightness to transition from the first display region to the third display region. As a result, the clear dividing line between the first display region and the third display region is avoided, the complexity of driving of the full screen can be reduced, and a wiring space can be saved.

Figure 2:
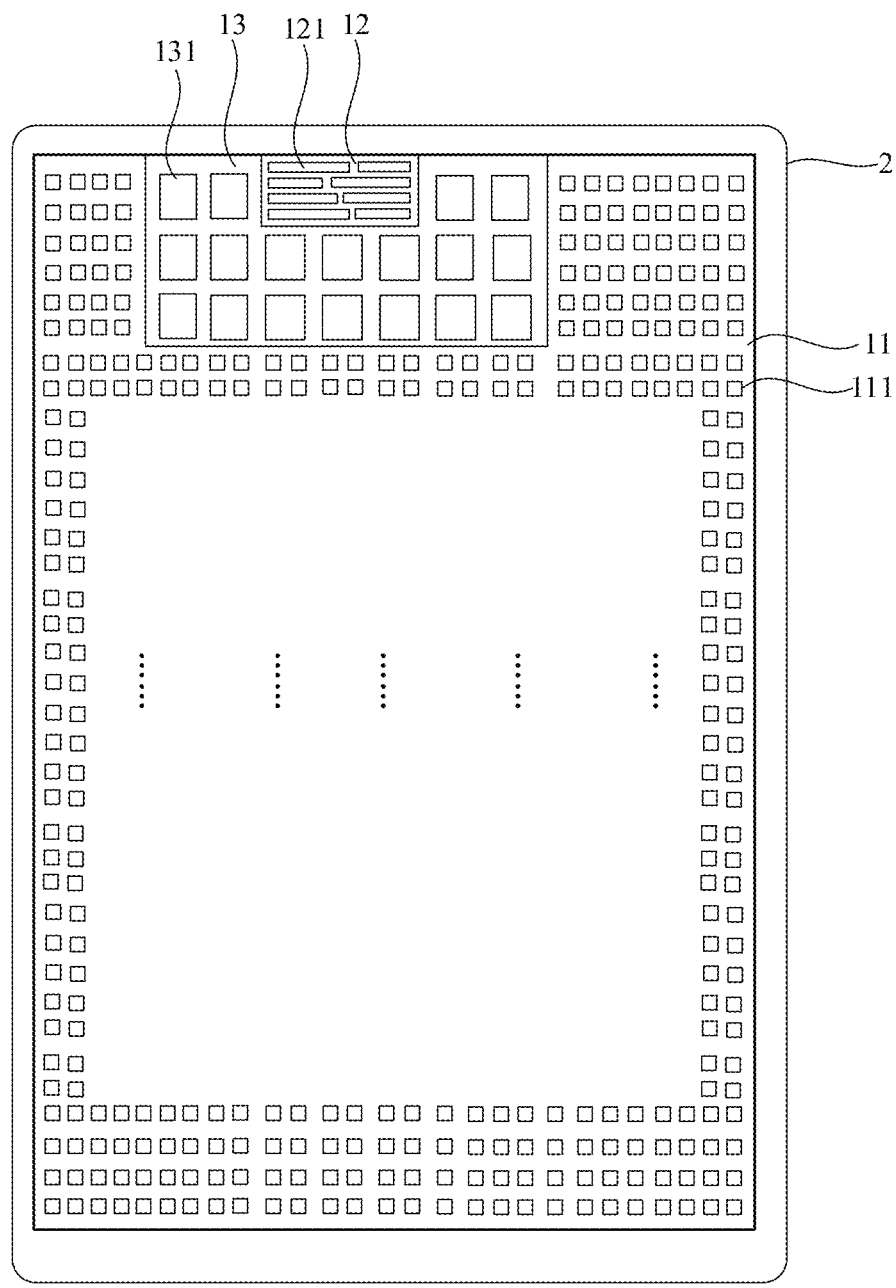
FIG. 2 is a schematic structure diagram of an OLED array substrate according to an embodiment of the present disclosure.

Referring to FIG. 2, an embodiment of the present disclosure provides an OLED array substrate. The OLED array substrate 2 includes a first display region 11 and a second display region 13. The first display region 11 is adjacent to the second display region 13. The first display region 11 includes a plurality of first OLED pixels 111 arranged in an array; and an OLED pixel arranged in the first display region 11 is defined as a first OLED pixel 111. The second display region 13 includes a plurality of second OLED pixels 131 arranged in an array; and an OLED pixel arranged in the second display region 13 is defined as a second OLED pixel 131. A pixel density of the second OLED pixels 131 (that is, the number of pixels in the display region per unit area) is less than a pixel density of the first OLED pixels 111. Since in most embodiments, a gap between pixels is very small and the display region is substantially filled by all pixels in it, when the pixel density is reduced, the gap between adjacent pixels can remain unchanged, and an area of each pixel in the display region can increase. The pixel density of the second display region 13 is less than the pixel density of the first display region 11, and an area of each second OLED pixel 131 of the second display region 13 can be greater than the area of each first OLED pixel 111 of the first display region 11. Since the pixels in each display region are arranged in an array, the second OLED pixels 131 in the same row can correspond to multiple rows of first OLED pixels 111, or there may be a row of first OLED pixels 111 that cannot correspond to any row of second OLED pixels 131. Similarly, the second OLED pixels 131 in the same column can correspond to multiple columns of the first OLED pixels 111, or there may be a column of first OLED pixels 111 that cannot correspond to any column of second OLED pixels 131.

In an embodiment, each OLED pixel is driven by a corresponding pixel driving unit; and pixel driving units are also correspondingly arranged in an array.

Figure 3:
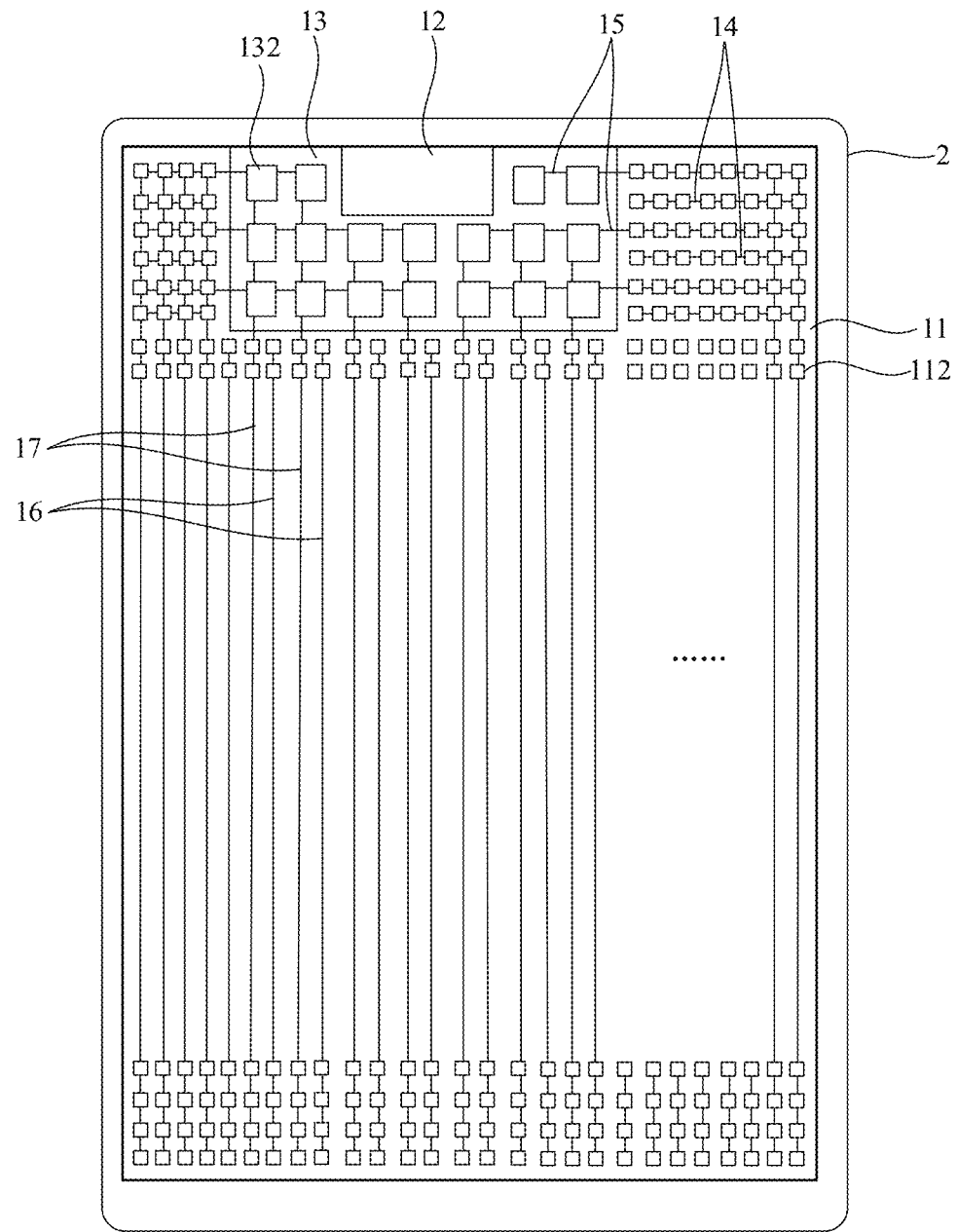
FIG. 3 is a schematic structure diagram of an OLED array substrate according to another embodiment of the present disclosure.

Referring to FIG. 3, a scan line connected to both the first pixel driving units 112 of the first OLED pixels 111 and the second pixel driving units 132 of the second OLED pixels 131 is defined as a first-type scan line 15. A scan line which is not connected to any second pixel driving unit 132 of the second OLED pixels 131 is defined as a second-type scan line 14. A data line connected to both the first pixel driving units 112 of the first OLED pixels 111 and the second pixel driving units 132 of the second OLED pixels 131 is defined as a first-type data line 17. A data line which is not connected to any second pixel driving unit 132 of the second OLED pixels 131 is defined as a second-type data line 16.

The second OLED pixels 131 and the first OLED pixels 111 can be located in the same row, and the pixel driving units 132 and 112 of the second OLED pixels 131 and the first OLED pixels 111 are connected to the same first-type scan line. In other words, the second pixel driving units 132 of the second OLED pixels 131 and the first pixel driving units 112 of the first OLED pixels 111 which are located in the same row are connected to the same first-type scan line 15. There is at least one second-type scan line 14 between two adjacent first-type scan lines 15. One second-type scan line 14 is only connected to the first pixel driving units 112 of the first OLED pixels 111 in the same row, that is, the same second-type scan line 14 only scans first OLED pixels 111 in the same row. And/or, the second OLED pixels 131 and the first OLED pixels 111 can be located in the same column, and the pixel driving units 132 and 112 are connected to the same set of first-type data lines 17. In other words, the second pixel driving units 132 of the second OLED pixels 131 and the first pixel driving units 112 of the first OLED pixels 111 located in the same column are connected to the same set of first-type data lines 17. There is at least one set of second-type data lines 16 between adjacent two sets of the first-type data lines 17. A set of the second-type data lines 16 is only connected to the first pixel driving units 112 of the first OLED pixels 111 in the same column, that is, the same set of second-type data lines 16 only drives the first OLED pixels 111 in the same column. The same set of data lines refers to multiple data lines configured to drive different sub-pixels in each pixel of the same column.

In an embodiment, there is one second-type scan line 14 between two adjacent first-type scan lines 15; and a length of a second OLED pixel 131 in a direction of the scan line can be at least twice a length of a first OLED pixel 111 in a direction of the scan line. In an embodiment, there is one set of second-type data lines 16 between two adjacent sets of first-type data lines 17; and the length of the second OLED pixel 131 in a direction of the data line can be at least twice the length of the first OLED pixel in a direction of the data line.

There is at least one second-type scan line between two adjacent first-type scan lines, which can implement display of pixels in interlaced rows in the second display region. There is at least one set of second-type data lines between two adjacent sets of first-type data lines, which can implement the display of pixels in interlaced columns in the second display region. In such a way, when using a Sub Pixel Rendering (SPR) method to process the original image data of the same frame to obtain the image data of the same frame displayed in the second display region, crosstalk between image data of adjacent second OLED pixels in the second display region can be weakened, and the difficulty of image processing is reduced.

Moreover, in the embodiment, the pixels in the second display region can share the data lines and scan lines of the pixels in the first display region, thereby saving the wiring space and simplifying the manufacturing process.

For ease of understanding, the Sub Pixel Rendering (SPR) is briefly introduced below. When the image data of one frame includes sub-image data of 1920 rows and 720 columns of pixels, if a display resolution of 1920*1080 is required, the sub-image data of (1080-720) columns of pixels can be obtained by calculation. For example, a calculation method for the sub-image data of one column and 1920 rows of pixels includes: sub-image data of one column and 1920 rows of pixels can be obtained by calculation according to sub-image data of the adjacent T rows and adjacent T columns of pixels, and then the sub-image data of the one column and 1920 rows of pixels is inserted into the sub-image data of the adjacent T rows and adjacent T columns of pixels to drive the display panel to display, thereby increasing the display resolution. Where T is a natural number greater than 1.

When the second pixel driving units of one row of second OLED pixels in the second display region and the first pixel driving units of the first OLED pixels located in the same row in the first display region are connected to the same first-type scan line, there is at least one second-type scan line between two adjacent first-type scan lines; at the same time, the second pixel driving units of the second OLED pixels and the first pixel driving units of the first OLED pixels in the same column are connected to the same set of first-type data lines; when there is at least one set of second-type data lines between two adjacent sets of first-type data lines, at least one row of image data between two rows of image data displayed by two adjacent rows of second OLED pixels is not displayed; and at least one column of image data between two columns of image data displayed by two adjacent columns of second OLED pixels is not displayed. Since two adjacent rows of second OLED pixels in the second display region are configured to display two rows of image data, at least one row of image data between the two rows of image data is not displayed; at the same time, two adjacent columns of second OLED pixels are configured to display the two columns of image data, and at least one column of image data between the two columns of image data is not displayed. In such a way, when performing the sub-pixel rendering operation on the original image data to obtain the above displayed image data, the image data of one pixel in the original image data only affects the image data of one pixel in the displayed image data, which can make the image data of adjacent pixels in the displayed image data not affected by the crosstalk, accordingly, the difficulty of image processing is reduced.

Figure 4:
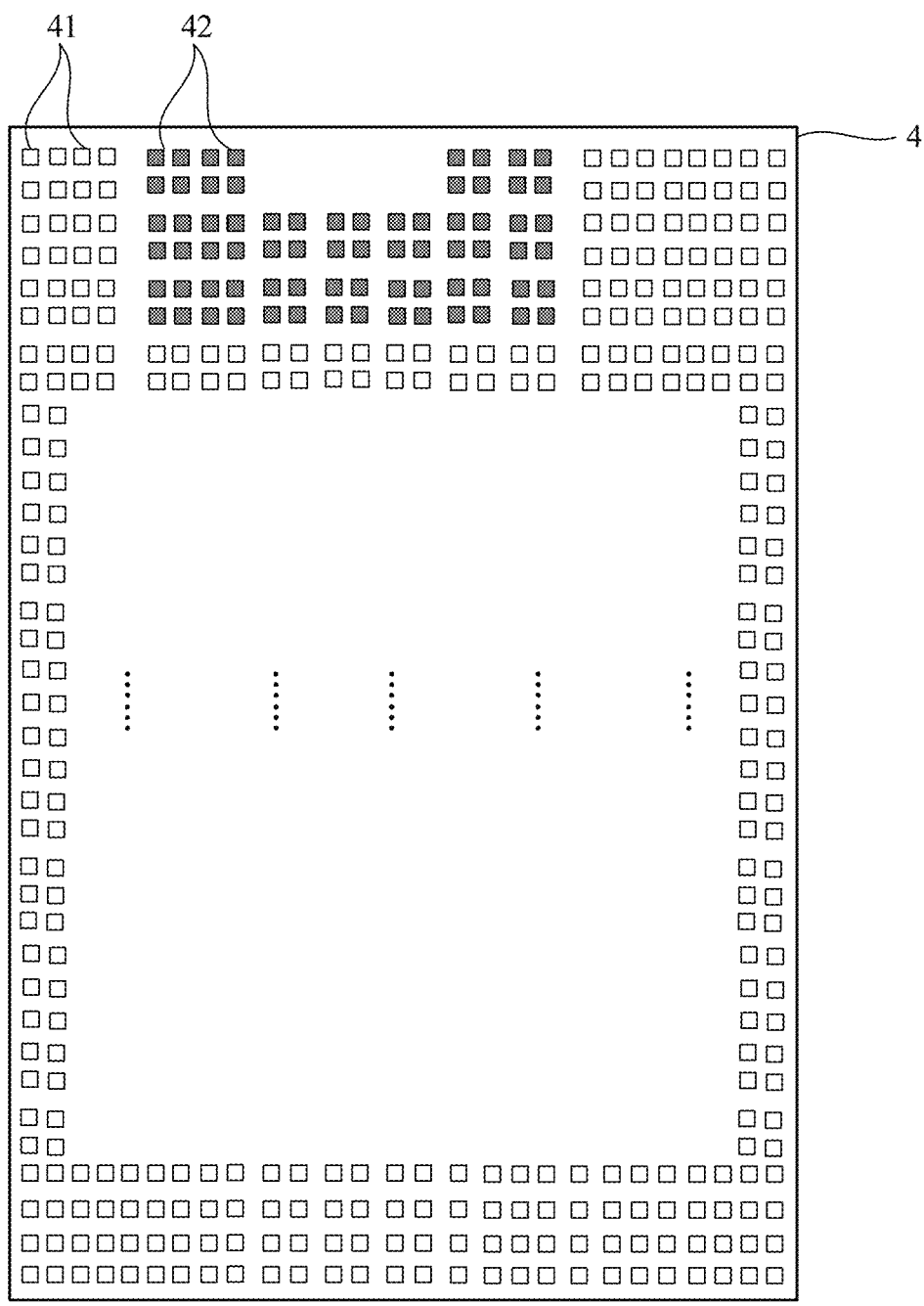
FIG. 4 is a schematic diagram showing image data of one frame after a sub-pixel rendering operation according to an embodiment of the present disclosure.

For example, referring to FIG. 4, the image data 4 of one frame after the sub-pixel rendering operation can include a first rendered image data 41 and a second rendered image data 42. The image data 4 is the displayed image data. The first rendered image data 41 is image data displayed in the first display region 11; and the second rendered image data 42 is image data displayed in the second display region 13. The amount of the first rendered image data 41 can be adapted to the number of the first OLED pixels 111, and the amount of the second rendered image data 42 can be more than the number of the second OLED pixels 131. The first rendered image data 41 can be allocated to a corresponding first OLED pixel 111 in an array, and the second rendered image data 42 can also be partitioned in an array, but only partially allocated to the second OLED pixels 131. A relationship between the pixels in the first display region 11 and the second display region 13 and the image data 4 of one frame is as follows.

For the first display region 11, two adjacent rows of first OLED pixels 111 are configured to display two adjacent rows of first rendered image data 41; and two adjacent columns of first OLED pixels 111 are configured to display two adjacent columns of first rendered image data 41. For example, the seventh row of first OLED pixels 111 is configured to display the seventh row of first rendered image data 41; the eighth row of first OLED pixels 111 is configured to display the eighth row of first rendered image data 41; the first column of first OLED pixels 111 is configured to display the first column of first rendered image data 41; and the second column of first OLED pixels 111 is configured to display the second column of first rendered image data 41.

For the second display region 13, two adjacent rows of second OLED pixels 131 are configured to display two rows of second rendered image data 42; there is at least one row of second rendered image data 42 between two rows of second rendered image data 42, and which is not displayed. In other words, two adjacent rows of second OLED pixels 131 are configured to display two non-adjacent rows of second rendered image data 42; there is at least one row of second rendered image data 42 between the two non-adjacent rows of second rendered image data 42, and which is not displayed. Two adjacent columns of second OLED pixels 131 are configured to display two columns of second rendered image data 42. There is at least one column of third rendered image data 42 between two columns of second rendered image data 42, and which is not displayed. That is, two adjacent columns of second OLED pixels 131 are configured to display two non-adjacent columns of second rendered image data 42. There is at least one column of second rendered image data 42 between the two non-adjacent columns of second rendered image data 42, and which is not displayed. In addition, as long as a row or a column in which certain second rendered image data 42 is located is a non-display row or a non-display column, this row or column of second rendered image data 42 is not displayed. For example, the second row of second OLED pixels 131 is configured to sequentially display the first column, the third column, the fifth column, the seventh column, the ninth column and the eleventh column of second rendered image data 42 in the third row of second rendered image data 42. The third row of second OLED pixels 131 is configured to sequentially display the first column, the third column, the fifth column, the seventh column, the ninth column and the eleventh column of third rendered image data 42 in the fifth row of third rendered image data 42. That is, the second OLED pixels 131 in the second display region 13 are configured to display the second rendered image data 42 in interlaced rows and columns.

As shown in FIG. 3, in an embodiment, only one second-type scan line 14 between two adjacent first-type scan lines 15 is able to make the second display region displayed in interlaced rows. Therefore, the difficulty of image processing can be reduced, and the resolution of the second display region can be prevented from significantly decreasing.

In another embodiment, only one set of second-type data lines 16 between two adjacent sets of first-type data lines 17 is able to make the second display region displayed in interlaced columns. Therefore, the difficulty of image processing can be reduced, and the resolution of the second display region can be prevented from significantly decreasing.

In another embodiment, only one second-type scan line 14 between two adjacent first-type scan lines 15, and only one set of second-type scan lines 16 between two adjacent sets of first-type data lines 17, are able to make the second display region displayed in interlaced rows and columns. Therefore, the difficulty of image processing can be reduced, and the resolution of the second display region can be prevented from significantly decreasing.

In an embodiment, as shown in FIG. 3, the n-th row of first pixel driving units 112 in the first display region 11 and the first row of second pixel driving units 132 in the second display region 13 are connected to the first-type scan line 15 in the first row. The (n+1)-th row of first pixel driving units 112 in the first display region 11 is connected to one row of the second-type scan line 14. The (n+2)-th row of first pixel driving units 112 in the first display region 11 and the second row of second pixel driving units 132 in the second display region 13 are connected to the first-type scan line 15 in the second row. For example, n can be greater than or equal to 1 and n is an integer.

In an embodiment, as shown in FIG. 3, the m-th column of first pixel driving units 112 in the first display region 11 and the first column of second pixel driving units 132 in the second display region 13 are connected to a first-type data line 17 in the first column. The (m+1)-th column of first pixel driving units 112 in the first display region 11 is connected to one column of the second-type data line 16. The (m+2)-th column of first pixel driving units 112 in the first display region 11 and the second column of second pixel driving units 132 in the second display region 13 are connected to the first-type data line 17 in the second column. Where m can be greater than or equal to 1, and m is an integer. For example, in FIG. 3, m can be equal to 6. In practical used, m can be determined according to the requirements.

Figure 5:
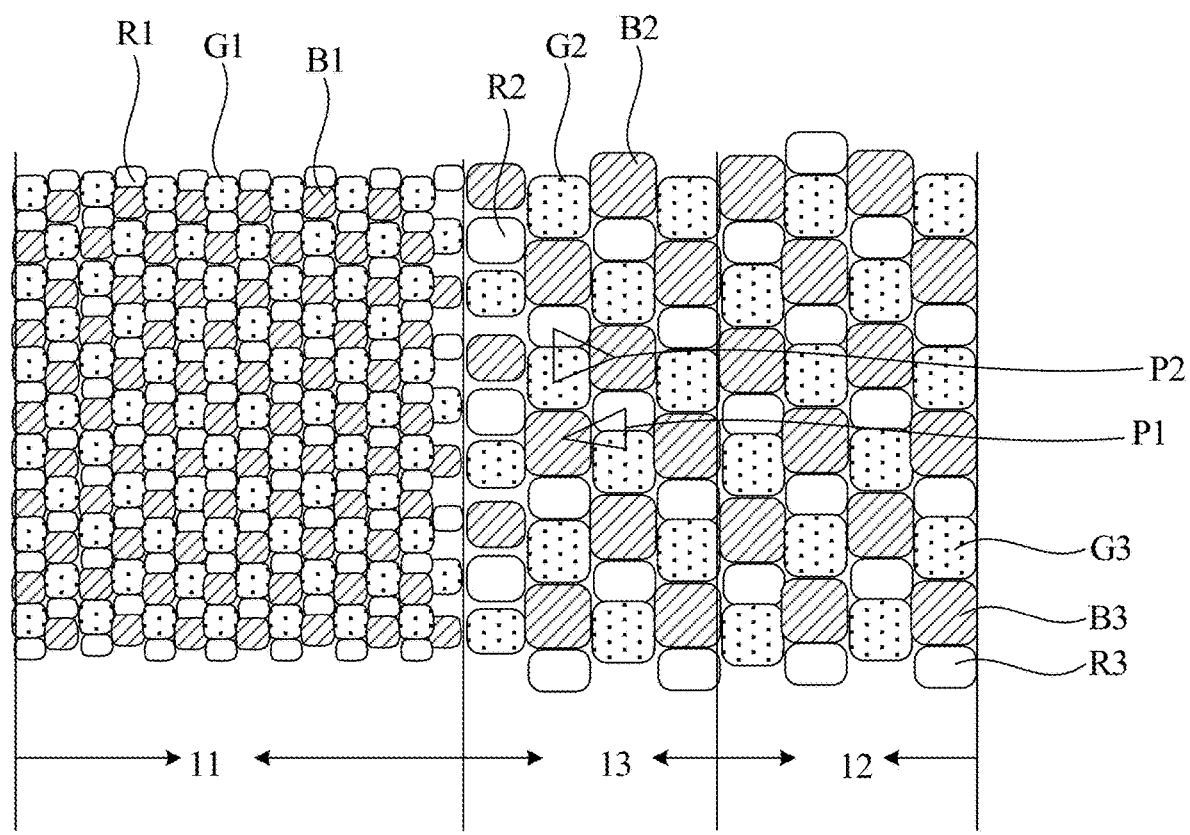
FIG. 5 is a schematic structure diagram of an OLED array substrate according to another embodiment of the present disclosure.

Each OLED pixel, such as the first OLED pixel 111 and the second OLED pixel 131, includes a plurality of sub-pixels of different colors. Referring to FIG. 5, in an embodiment, the first OLED pixel 111 includes a first red sub-pixel R1, a first green sub-pixel G1, and a first blue sub-pixel B1 arranged in a triangle. The second OLED pixel 131 includes a second red sub-pixel R2, a second green sub-pixel G2, and a second blue sub-pixel B2 arranged in a triangle. In the first display region 11, three sub-pixels of a first OLED pixel 111 in an odd row arranged in a triangle are engaged with three sub-pixels of a first OLED pixel 111 in an even row arranged in a triangle, so as to achieve a dense arrangement. Similarly, three sub-pixels of a second OLED pixel 131 in an odd row in the second display region 13 that are arranged in a triangle are engaged with three sub-pixels of a second OLED pixel 131 in an even row that are arranged in a triangle, so as to achieve the dense arrangement.

In the embodiment, the sub-pixels of the first OLED pixel 111 in an odd row in the first display region 11 are arranged in a first order. For example, the first order is indicated by the first red sub-pixel R1, the first green sub-pixel G1, and the first blue sub-pixel B1. The sub-pixels of the first OLED pixel 111 in an even row in the first display region 11 are arranged in a second order. For example, the second order is indicated by the first blue sub-pixel B1, the first green sub-pixel G1, and the first red sub-pixel R1.

The first pixel driving unit 112 can include a first pixel circuit (not shown), a second pixel circuit (not shown), and a third pixel circuit (not shown) arranged side by side. The first pixel circuit is connected to the first red sub-pixel R1, the second pixel circuit is connected to the first green sub-pixel G1, and the third pixel circuit is connected to the first blue sub-pixel B1.

In the embodiment, the pixel circuits in the first pixel driving unit 112 in an odd row can be arranged in a third order; and the pixel circuits in the first pixel driving unit 112 in an even row can be arranged in a fourth order. The third order is indicated by the first pixel circuit, the second pixel circuit, and the third pixel circuit; the fourth order is indicated by the third pixel circuit, the second pixel circuit, and the first pixel circuit.

In the embodiment, as shown in FIG. 5, the sub-pixels of the second OLED pixel P1 in an odd row in the second display region 13 (three sub-pixels corresponding to a triangle pointed to by P1) are arranged in a fifth order; the sub-pixels of the second OLED pixel P2 in an even row in the second display region (three sub-pixels corresponding to a triangle pointed to by P2) are arranged in a sixth order. A row where the second OLED pixel P1 is located is an odd row; and a row where the second OLED pixel P2 is located is an even row. The fifth order is indicated by the second blue sub-pixel B2, the second green sub-pixel G2, the second red sub-pixel R2; the sixth order is indicated by the second red sub-pixel R2, the second green sub-pixel G2, and the second blue sub-pixel B2.

Of course, the sub-pixels of the second OLED pixel in an odd row in the second display region can also be arranged in the sixth order; and the sub-pixels of the second OLED pixel in an even row in the second display region can also be arranged in accordance with the fifth order.

In the embodiment, the second pixel driving unit 132 includes a fourth pixel circuit (not shown), a fifth pixel circuit (not shown), and a sixth pixel circuit (not shown) arranged side by side. The fourth pixel circuit is connected to the second red sub-pixel R2, the fifth pixel circuit is connected to the second green sub-pixel G2, and the sixth pixel circuit is connected to the second blue sub-pixel B2.

The pixel circuits in the second pixel driving unit 132 in an odd row are arranged in a seventh order, and the pixel circuits in the first pixel driving unit 112 in an even row are arranged in an eighth order. The seventh order is indicated by the sixth pixel circuit, the fifth pixel circuit, and the fourth pixel circuit; the eighth order is indicated by the fourth pixel circuit, the fifth pixel circuit, and the sixth pixel circuit.

Figure 6:
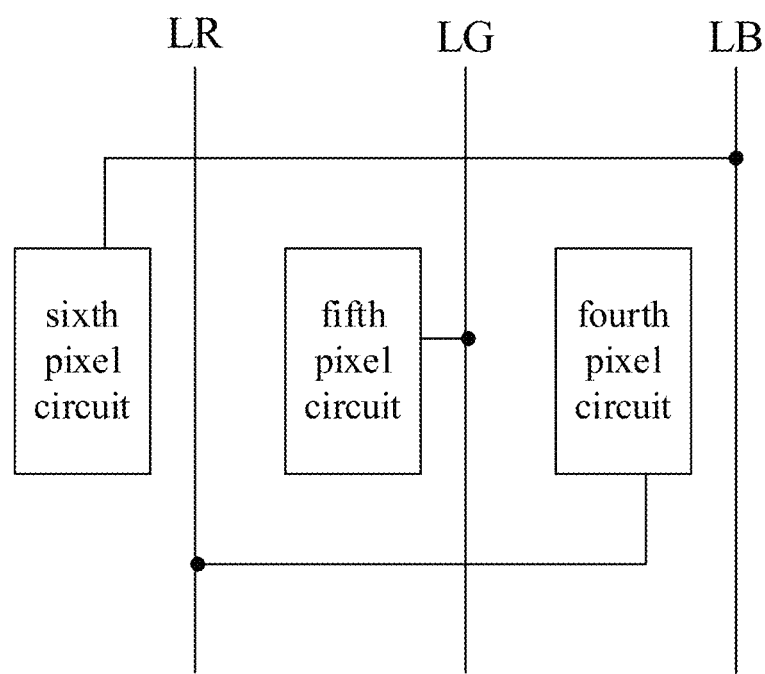
FIG. 6 is a schematic structure diagram of a first-type data line in an OLED array substrate according to another embodiment of the present disclosure.

Referring to FIG. 6, the same set of first-type data lines 17 includes a first data line LR, a second data line LG, and a third data line LB. The first data line LR is configured to transmit a red data signal; the second data line LG is configured to transmit a green data signal; and the third data line LB is configured to transmit a blue data signal. The fourth pixel circuit is connected to the first data line LR; the fifth pixel circuit is connected to the second data line LG; and the sixth pixel circuit is connected to the third data line LB.

Figure 7:
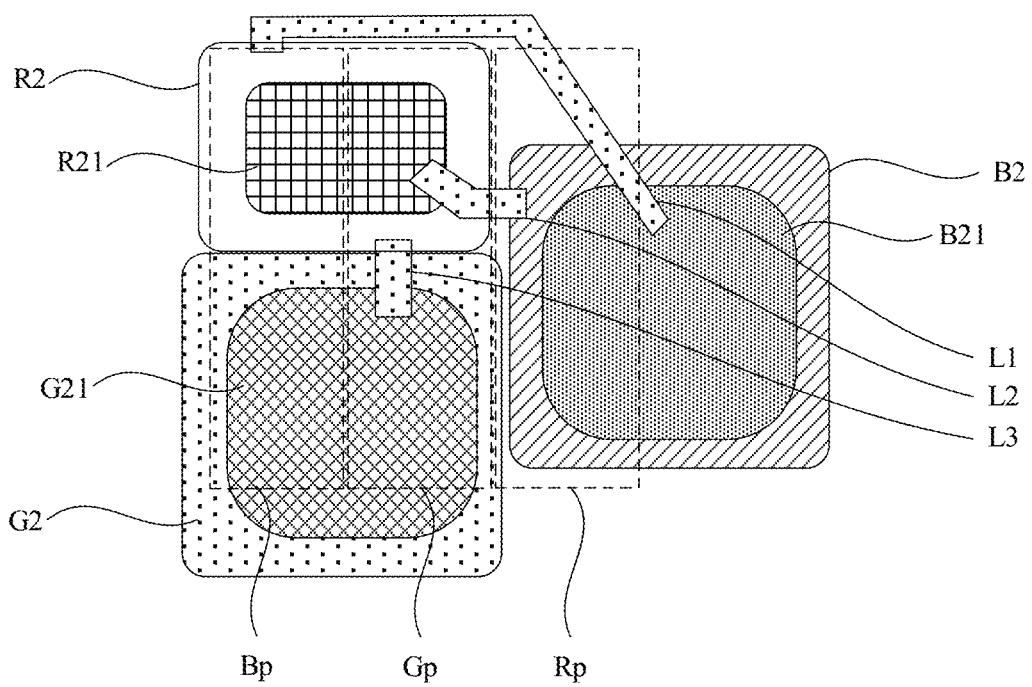
FIG. 7 is a schematic diagram illustrating a connection structure between pixels and pixel circuits in an OLED array substrate according to another embodiment of the present disclosure.

Referring to FIG. 7, in an embodiment, when the sub-pixels in the second OLED pixel P1 in an odd row in the second display region 13 are arranged in the sixth order (R2, G2, B2), and the pixel circuits in the second pixel driving unit 132 in an odd row are arranged in the seventh order (Bp, Gp, Rp), a wire L2 connected between an anode R21 of the second red sub-pixel R2 and the fourth pixel circuit Rp is in a non-linear form; a wire L3 connected between an anode G21 of the second green sub-pixel G2 and the fifth pixel circuit Gp can be in a linear form; a wire L1 connected between an anode B21 of the second blue sub-pixel B2 and the sixth pixel circuit Bp can be non-linear.

In the above description, the sub-pixels of the first OLED pixel in an odd row in the first display region are arranged in the first order, and the sub-pixels of the first OLED pixel in an even row are arranged in the second order as an example. It can be understood that, in practical applications, the sub-pixels of the first OLED pixel in an odd row in the first display region can be arranged in the second order, and the sub-pixels of the first OLED pixel in an even row can be arranged in the first order.

Similarly, in practical applications, the pixel circuits in the first pixel driving unit in an odd row can be arranged in a fourth order, and the pixel circuits in the first pixel driving unit in an even row can be arranged in the third order. The pixel circuits in the second pixel driving unit in an odd row can be arranged in the eighth order, and the pixel circuits in the second pixel driving unit in an even row can be arranged in the seventh order.

In addition, it should be noted that the first red sub-pixel, the first green sub-pixel, and the first blue sub-pixel included in the first OLED pixel are merely exemplary to represent three different sub-pixels, and are not limited to only including the first red sub-pixel, the first green sub-pixel, and the first blue sub-pixel (red, green, and blue sub-pixels); and the first OLED pixel may also have a pixel structure including other numbers of sub-pixels of other colors. The sub-pixels in the first OLED pixel are not limited to a triangular arrangement, and other arrangements can also be used. In the same way, the second OLED pixel and the third OLED pixel are also applicable to the above situation of the first OLED pixel.

In an embodiment, as shown in FIG. 2, the OLED array substrate 2 can further include a third display region 12. The third display region 12 is adjacent to the second display region 13, and is located on a side of the second display region 13 away from the first display region 11.

A light transmittance of the third display region 12 is greater than that of the first display region 11; and the light transmittance of the third display region 12 is also greater than that of the second display region 13. Therefore, a light sensor device can be placed behind the third display region, which is beneficial to increase a screen-to-body ratio.

In an embodiment, the third display region 12 can be rectangular. Of course, the third display region 12 can also have any of the following shapes: a water-drop shape, a circle, an ellipse, a diamond, a semicircle, or a semi-ellipse.

In an embodiment, as shown in FIG. 2, the third display region 12 includes a plurality of third OLED pixels 121 arranged in array. The pixel density of the third OLED pixels 121 is less than that of the first OLED pixels 111. The pixel density of the third OLED pixels 121 is also less than that of the second OLED pixels 131 in the second display region 13. Such arrangement is beneficial to increase the light transmittance of the third display region and improve the diffraction problem.

In an embodiment, as shown in FIG. 2, the third OLED pixels 121 in the third display region 12 can be arranged in an array of two columns and multiple rows.

In another embodiment, as shown in FIG. 5, a third OLED pixel 121 can include a third red sub-pixel R3, a third green sub-pixel G3, and a third blue sub-pixel B3 arranged in a triangle. A boundary region of the third display region 12 adjacent to the second display region 13 includes a plurality of third pixel driving units (not shown) of the third OLED pixels 121. A third pixel driving unit includes a seventh pixel circuit (not shown), an eighth pixel circuit (not shown), and a ninth pixel circuit (not shown). All the third red sub-pixels R3 in the same row can be connected to the seventh pixel circuit. All of the third green sub-pixels G3 in the same row can be connected to the eighth pixel circuit. All of the third blue sub-pixels B3 in the same row can be connected to the ninth pixel circuit.

One row of the first-type scan line 15 extends to the boundary region and is connected to the third pixel driving units; and a set of first-type data lines 17 extends to the boundary region and is connected to the third pixel driving units. The seventh pixel circuit is connected to the first data line. The eighth pixel circuit is connected to the second data line. The ninth pixel circuit is connected to the third data line.

Since the third pixel driving units of the third OLED pixels are arranged in the boundary region in the third display region adjacent to the second display region, the third pixel driving units can be prevented from affecting the light transmittance of positions in the third display region where the third OLED pixels are located.

The third red sub-pixels in the same row are all connected to the seventh pixel circuit; the third green sub-pixels in the same row are all connected to the eighth pixel circuit; and the third blue sub-pixels in the same row are all connected to the ninth pixel circuit. In such a way, one third pixel driving unit can be utilized to drive the third OLED pixel in the third display region to reduce an area occupied by the pixel circuit.

In an embodiment, as shown in FIG. 5, a size of the second OLED pixel 131 in the second display region 13 adjacent to a third display region side is greater than a size of the second OLED pixel 131 in the second display region 13 adjacent to the third display region. A distance between two adjacent second OLED pixels 131 in the second display region 13 adjacent to a third display region side is less than a distance between two adjacent second OLED pixels 131 in the second display region 13 adjacent to a side of the first display region. In such a way, the display brightness in the second display region 13 can be transitioned from the first display region side to the third display region side.

In an embodiment, the OLED array substrate can further include a substrate, a first electrode layer disposed on the substrate, a light emitting structure layer disposed on the first electrode layer, and a second electrode layer disposed on the light emitting structure layer.

The first electrode layer in the third display region includes a plurality of first electrode groups arranged along a first direction. Each of the first electrode groups includes a plurality of first electrodes. The first electrodes in a first electrode group extend in a second direction; and the second direction intersects the first direction. Each of the first electrodes includes one or more first electrode blocks. When the first electrode includes a plurality of first electrode blocks, two adjacent first electrode blocks are electrically connected. The third display region includes a plurality of sub-display regions. At least one edge of each sub-display region is adjacent to the second display region. Each first electrode is only arranged in one sub-display region, and different first electrodes are driven by different pixel circuits.

The first electrode layer of the OLED array substrate in the first display region includes a plurality of first electrodes. Each first electrode is only arranged in one sub-display region. Different first electrodes are driven by different pixel circuits. Therefore, a sub-pixel corresponding to a first electrode in each sub-display region can be individually controlled, and then a data line input voltage of a pixel circuit corresponding to a first electrode in a sub-display region can be controlled according to the brightness of the second display region adjacent to the sub-display region. Accordingly, the display brightness of each sub-display region can be individually adjusted, such that the display brightness of each sub-display region is approximate to the brightness of the adjacent second display region, thereby avoiding a larger display brightness difference between the third display region and the second display region, and then improving the user experience.

In some embodiments, among the plurality of first electrodes of the first electrode group, there is a gap between two adjacent first electrodes, and the two adjacent first electrodes are insulated from each other. Gaps between the plurality of first electrode groups are staggered in the first direction.

The gaps between the plurality of first electrode groups are staggered in the first direction, such that the dividing line between two adjacent sub-display regions is an irregular broken line. When the display brightness of different sub-display regions is different, such arrangement can weaken the perception of human eyes to the difference in the display brightness of adjacent sub-display regions, and thus can improve the user experience. In addition, the gaps between the plurality of first electrode groups are staggered in the first direction, which can also weaken the perception of human eyes to the diffraction fringes generated when an external light ray enters the first display region, and thus is beneficial to improve the user experience as well.

In some embodiments, each first electrode group includes two first electrodes; the third display region includes two sub-display regions; and the two first electrodes of the first electrode group are respectively arranged in the two sub-display regions.

In such a way, a pixel circuit corresponding to a first electrode in each sub-display region can be provided at a position in the transition display region adjacent to the sub-display region. The transition display region is located in the second display region, so as to help reduce wiring in the third display region.

In some embodiments, the pixel circuit corresponding to the first electrode is a 1T pixel circuit (a pixel circuit consisting of one transistor), or a 2T1C pixel circuit (a pixel circuit consisting of two transistors and one capacitor), or a 3T1C pixel circuit (a pixel circuit consisting of three transistors and one capacitor), or a 3T2C pixel circuit (a pixel circuit consisting of three transistors and two capacitors), or a 7T1C pixel circuit (a pixel circuit consisting of seven transistors and one capacitor), or a 7T2C pixel circuit (a pixel circuit consisting of seven transistors and two capacitors).

In some embodiments, a projection of the first electrode block on the substrate consists of one first pattern unit or a plurality of connected first pattern units. The first pattern unit includes a circle, an ellipse, a dumbbell, a gourd shape or a rectangle. The above-mentioned patterns such as the circle, the ellipse, the dumbbell and the gourd shape can change a periodic structure of the generation of the diffraction, that is, change the distribution of the diffraction field, thereby reducing the diffraction phenomenon, and then ensuring that the image taken by the camera provided behind the third display region has a higher definition.

In some embodiments, the light-emitting structure layer includes a light-emitting structure block correspondingly provided on each first electrode block. The projection of the light-emitting structure block on the substrate consists of one second pattern unit or a plurality of connected second pattern units; and the second pattern unit is the same as or different from the first pattern unit. The second pattern unit includes a circle, an ellipse, a dumbbell, a gourd shape or a rectangle. The above-mentioned patterns such as the circle, the ellipse, the dumbbell and the gourd shape can change the periodic structure of the generation of the diffraction, that is, change the distribution of the diffraction field, thereby reducing the diffraction phenomenon, and ensuring that the image taken by the camera provided behind the third display region has a higher definition.

An embodiment of the present disclosure further provides a display panel, which includes the OLED array substrate described in any of the above embodiments and an encapsulation layer.

The encapsulation layer is encapsulated on a side of the OLED array substrate away from the substrate of the OLED array substrate.

In an embodiment, when the OLED array substrate further includes the above-mentioned third display region, a photosensitive device can be provided behind the third display region.

In an embodiment, at least a part of the third display region on the OLED array substrate is surrounded by the second display region.

In an embodiment, the encapsulation layer includes a polarizer. The polarizer covers the first display region and the second display region, but does not cover the third display region. Since the polarizer can eliminate an ambient light ray entering the display panel from being reflected out of the display panel again, the polarizer can eliminate the ambient light ray from interfering with the normal display of the display panel.

An embodiment of the present disclosure further provides a display device, which includes a device body and the display panel described in any of the above embodiments. The device body has a device region. The display panel covers the device body. The device region is located behind the third display region; and in the device region is provided a photosensitive device which emits or collects the light ray through the third display region;

The photosensitive device includes at least one of: a camera, a light sensor, and a light emitter.

It should be noted that the display device in the embodiment can be any product or component with a display function, such as an electronic paper, a mobile phone, a tablet computer, a television, a notebook computer, a digital photo frame, a navigator, etc.

It should be noted that in the drawings, the sizes of layers and regions may be exaggerated for clarity of illustration. It will also be understood that when an element or layer is referred to as being "on" another element or layer, it can be directly on the other element or there may be an intermediate layer. In addition, it should be understood that when an element or layer is referred to as being "under" another element or layer, it may be directly under the other element, or there may be an intermediate layer or element. In addition, it should also be understood that when a layer or element is referred to as being "between" two layers or two elements, it can be the only layer between the two layers or two elements, or there may be more than one intermediate layers or elements. Similar reference signs indicate similar elements throughout.

In the present disclosure, the terms "first" and "second" are merely used for descriptive purposes, rather than being understood as indicating or implying relative importance. The term "plurality" refers to two or more, unless specifically defined otherwise.

After considering the specification and practicing the disclosure disclosed herein, those skilled in the art can easily conceive other embodiments of the present disclosure. The present disclosure is intended to cover any variations, uses, or adaptive changes of the disclosure, which follow the general principle of the disclosure and include common knowledge or customary technical means in the technical field not disclosed in the present disclosure. The description and embodiments are merely regarded as exemplary, and the true scope and spirit of the disclosure are subject to the following appended claims.

What is claimed is:

1. An OLED array substrate, comprising a first display region and a second display region; wherein, the first display region is adjacent to the second display region, the first display region comprises a plurality of first OLED pixels arranged in an array, the second display region comprises a plurality of second OLED pixels arranged in an array, a pixel density of the second OLED pixels is less than a pixel density of the first OLED pixels;

a plurality of second pixel driving units of the second OLED pixels and first pixel driving units of the first OLED pixels which are located in a same row are connected to a same first-type scan line, there is at least one second-type scan line between two adjacent first-type scan lines, wherein one second-type scan line is only connected to the first pixel driving units of first OLED pixels which are located in a same row;

wherein two first-type scan lines connected to the second pixel driving units located in the same row are arranged to disconnect with each other, wherein one of the two first-type scan line is configured to connect the first pixel driving units at one side of the first display region and the second pixel driving units at one side of the second display region, and the other first-type scan line is configured to connect the first pixel driving units at the other side of the first display region and the second pixel driving units at the other side of the second display region;

the OLED array substrate further comprising a third display region, wherein the third display region is adjacent to the second display region, the third display region is located at a side of the second display region away from the first display region, wherein a light transmittance of the third display region is greater than a light transmittance of the first display region, and the light transmittance of the third display region is greater than a light transmittance of the second display region;

wherein two first-type scan lines connected to the second pixel driving units located in the same row in the second display region and between the first display region and the third display region are arranged to disconnect with each other, wherein one of the two first-type scan line is configured to connect the first pixel driving units at one side of the first display region and the second pixel driving units at one side of the second display region, and the other first-type scan line is configured to connect the first pixel driving units at the other side of the first display region and the second pixel driving units at the other side of the second display region; wherein the second pixel driving units connected to one end of one first-type scan line are adjacent to the second pixel driving units connected to one end of the other first-type scan line;

wherein two first-type scan lines connected to the second pixel driving units located in the same row in the second display region and on two opposite sides of the third display region are arranged to disconnect with each other, wherein one of the two first-type scan line is configured to connect the first pixel driving units at one side of the first display region and the second pixel driving units at one side of the second display region, and the other first-type scan line is configured to connect the first pixel driving units at the other side of the first display region and the second pixel driving units at the other side of the second display region; wherein the second pixel driving units connected to one end of one first-type scan line are separated from the second pixel driving units connected to one end of the other first-type scan line by the third display region;

wherein the third display region comprises third OLED pixels arranged in an array;

a pixel density of the third OLED pixels is less than the pixel density of the first OLED pixels in the first display region; and the pixel density of the third OLED pixels is less than the pixel density of the second OLED pixels in the second display region.

2. The OLED array substrate according to claim 1, wherein the second pixel driving units of second OLED pixels and first pixel driving units of first OLED pixels which are located in a same column are connected to a same set of first-type data lines, there is at least one set of second-type data lines between two adjacent sets of first-type data lines, one set of second-type data lines is only connected to first pixel driving units of first OLED pixels which are located in a same column;

wherein there is only one second-type scan line between two adjacent first-type scan lines, there is only one set of second-type data lines between two adjacent sets of first-type data lines;

a n-th row of first pixel driving units in the first display region and a first row of second pixel driving units in the second display region are connected to a first row of a first-type scan line;

a (n+1)-th row of first pixel driving units in the first display region is connected to a row of a second-type scan line;

a (n+2)-th row of first pixel driving units in the first display region and a second row of second pixel driving units in the second display region are connected to a second row of a first-type scan line, and n is an integer greater than or equal to 1.

3. The OLED array substrate according to claim 2, wherein, an m-th column of first pixel driving units in the first display region and a first column of second pixel driving units in the second display region are connected to a first column of a first-type data line;

a (m+1)-th column of first pixel driving units in the first display region is connected to a column of a second-type data line; and a (m+2)-th column of first pixel driving units in the first display region and a second column of second pixel driving units in the second display region are connected to a second column of a first-type data line, and m is an integer greater than or equal to 1.

4. The OLED array substrate according to claim 1, wherein,
the third display region has any of following shapes: a water-drop shape, a circle, a rectangle, an ellipse, a diamond, a semicircle or a semi-ellipse.

5. The OLED array substrate according to claim 1, wherein:
the second pixel driving units of second OLED pixels and first pixel driving units of first OLED pixels which are located in a same column are connected to a same set of first-type data lines, there is at least one set of second-type data lines between two adjacent sets of first-type data lines, one set of second-type data lines is only connected to first pixel driving units of first OLED pixels which are located in a same column;
wherein a third OLED pixel comprises a third red sub-pixel, a third green sub-pixel, and a third blue sub-pixel arranged in a triangle;
a boundary region of the third display region adjacent to the second display region comprises a plurality of third pixel driving units of the third OLED pixels; a third pixel driving unit comprises a seventh pixel circuit, an eighth pixel circuit, and a ninth pixel circuit; all of the third red sub-pixels in a same row are connected to the seventh pixel circuit, all of the third green sub-pixels in a same row are connected to the eighth pixel circuit, and all of the third blue sub-pixels in a same row are connected to the ninth pixel circuit; and
a row of a first-type scan line extends to the boundary region and is connected to the third pixel driving units, a set of first-type data lines extends to the boundary region and is connected to the third pixel driving units, the seven pixel circuit is connected to the first data line, the eighth pixel circuit is connected to the second data line, and the ninth pixel circuit is connected to the third data line.

6. The OLED array substrate according to claim 1, wherein:
a size of a second OLED pixel in the second display region adjacent to a third display region side is greater than a size of a second OLED pixel in the second display region adjacent to a first display region side; and
a first distance between two adjacent second OLED pixels in the second display region adjacent to the third display region side is less than a second distance between two adjacent second OLED pixels in the second display region adjacent to the first display region side.

7. The OLED array substrate according to claim 1, wherein:
the OLED array substrate comprises a substrate, a first electrode layer disposed on the substrate, a light-emitting structure layer disposed on the first electrode layer, and a second electrode layer disposed on the light-emitting structure layer;
a first electrode layer located in the third display region includes a plurality of first electrode groups arranged along a first direction, each first electrode group comprises a plurality of first electrodes, the first electrodes in the first electrode group are arranged along a second direction, the second direction intersects the first direction;
each first electrode comprises one or more first electrode blocks; when a first electrode comprises a plurality of first electrode blocks, two adjacent first electrode blocks are electrically connected to each other; and
the third display region comprises a plurality of sub-display regions, and at least one edge of each sub-display region is adjacent to the second display region, each first electrode is only arranged in one sub-display region, and different first electrodes are driven by different pixel circuits.

8. The OLED array substrate according to claim 7, wherein in a plurality of first electrodes of a first electrode group, there is a gap between two adjacent first electrodes, and the two adjacent first electrodes are insulated from each other, and gaps between the plurality of first electrode groups are staggered in the first direction.

9. The OLED array substrate according to claim 8, wherein,
each first electrode group comprises two first electrodes, the third display region comprises two sub-display regions, and the two first electrodes of the first electrode group are respectively provided in the two sub-display regions.

10. The OLED array substrate according to claim 8, wherein,
a pixel circuit consisting of three transistors and two capacitors, or a pixel circuit consisting of seven transistors and two capacitors.

* * * * *